(12) United States Patent
Dasgupta et al.

(10) Patent No.: US 9,077,360 B2
(45) Date of Patent: Jul. 7, 2015

(54) EXTENSION OF ADC DYNAMIC RANGE USING POST-PROCESSING LOGIC

(71) Applicant: TEXAS INSTRUMENTS INCORPORATED, Dallas, TX (US)

(72) Inventors: Udayan Dasgupta, Bangalore (IN); Ganesan Thiagarajan, Bangalore (IN); Venugopal Gopinathan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/194,304

(22) Filed: Feb. 28, 2014

(65) Prior Publication Data

US 2014/0247176 A1 Sep. 4, 2014

Related U.S. Application Data

(60) Provisional application No. 61/922,271, filed on Dec. 31, 2013, provisional application No. 61/922,282, filed on Dec. 31, 2013, provisional application No. 61/922,291, filed on Dec. 31, 2013, provisional application No. 61/922,309, filed on Dec. 31, 2013, provisional application No. 61/922,316, filed on Dec. 31, 2013, provisional application No. 61/922,533, filed on Dec. 31, 2013.

(30) Foreign Application Priority Data

| Mar. 1, 2013 | (IN) | ............................. 913/CHE/2013 |
| Mar. 4, 2013 | (IN) | ............................. 927/CHE/2013 |
| Mar. 6, 2013 | (IN) | ............................. 971/CHE/2013 |
| Mar. 13, 2013 | (IN) | ............................ 1066/CHE/2013 |
| Mar. 15, 2013 | (IN) | ............................ 1132/CHE/2013 |

(51) Int. Cl.
| H03M 1/00 | (2006.01) |
| H03M 1/08 | (2006.01) |
| H03M 1/12 | (2006.01) |
| H03M 1/18 | (2006.01) |
| H03M 1/36 | (2006.01) |

(52) U.S. Cl.
CPC .......... *H03M 1/0836* (2013.01); *H03M 1/0845* (2013.01); *H03M 1/0854* (2013.01); *H03M 1/089* (2013.01); *H03M 1/124* (2013.01); *H03M 1/186* (2013.01); *H03M 1/1265* (2013.01); *H03M 1/36* (2013.01)

(58) Field of Classification Search
CPC ....... H03M 1/12; H03M 1/185; H03M 1/202; H03M 1/186; H03M 1/70; H03M 3/51
USPC ................................. 341/132, 139, 140, 155
See application file for complete search history.

(56) References Cited

U.S. PATENT DOCUMENTS 5,691,821 A * 11/1997 Hieda et al. ................. 348/217.1
5,844,512 A * 12/1998 Gorin et al. ................... 341/139

(Continued)

OTHER PUBLICATIONS

Akima, H., A New Method of Interpolation and Smooth Curve Fitting Based on Local Procedures, Journal of the Association of Computing Machinery, vol. 17, No. 4, Oct. 1970, pp. 589-602.

*Primary Examiner* — Linh Nguyen
(74) *Attorney, Agent, or Firm* — Alan A. R. Cooper; Frank D. Cimino

(57) ABSTRACT

An apparatus, comprising: an analog to digital converter including: a clipping detector; and a post-processor, wherein the post processor generates synchronous values of clipped data based on non-clipped values of non-clipped data.

15 Claims, 10 Drawing Sheets

(56) References Cited

U.S. PATENT DOCUMENTS

| | | | |
|---|---|---|---|
| 6,195,029 B1 * | 2/2001 | Urry et al. | 341/138 |
| 6,424,280 B2 * | 7/2002 | Sadkowski | 341/143 |
| 6,606,047 B1 * | 8/2003 | Borjesson et al. | 341/155 |
| 6,836,229 B2 * | 12/2004 | Gregoire | 341/139 |
| 6,943,712 B1 * | 9/2005 | Roo et al. | 341/120 |
| 7,202,804 B2 * | 4/2007 | Nakagaki et al. | 341/118 |
| 7,262,724 B2 * | 8/2007 | Hughes et al. | 341/139 |
| 7,928,883 B2 * | 4/2011 | Robertson et al. | 341/155 |
| 8,228,218 B2 * | 7/2012 | Eldar et al. | 341/118 |
| 2005/0245252 A1 * | 11/2005 | Kappes et al. | 455/423 |
| 2008/0218395 A1 * | 9/2008 | Tomioka et al. | 341/155 |

* cited by examiner

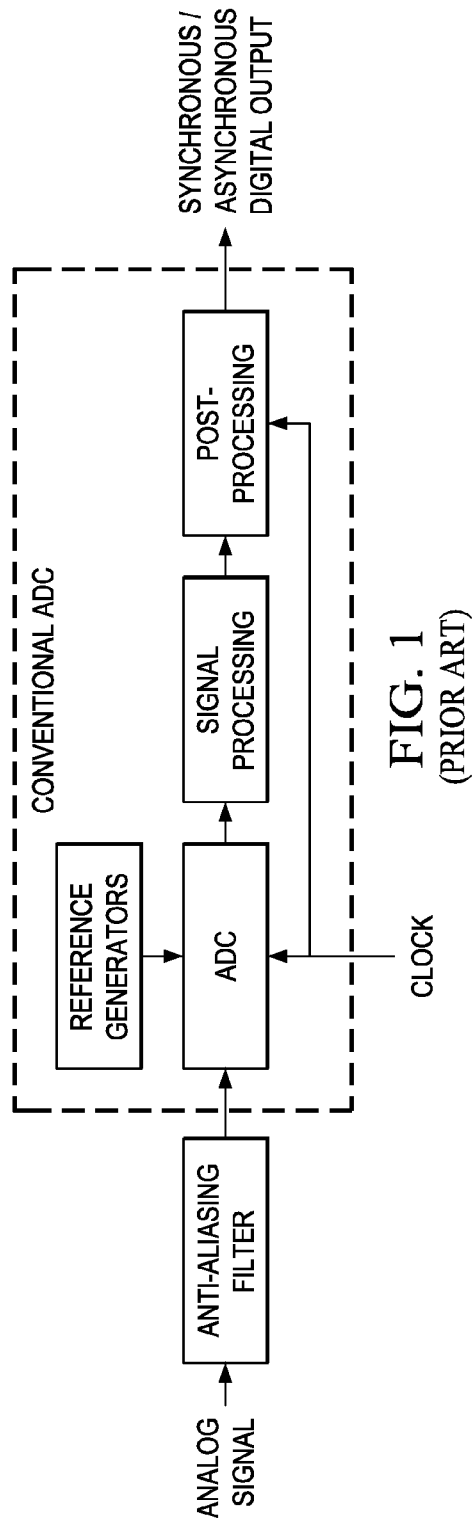
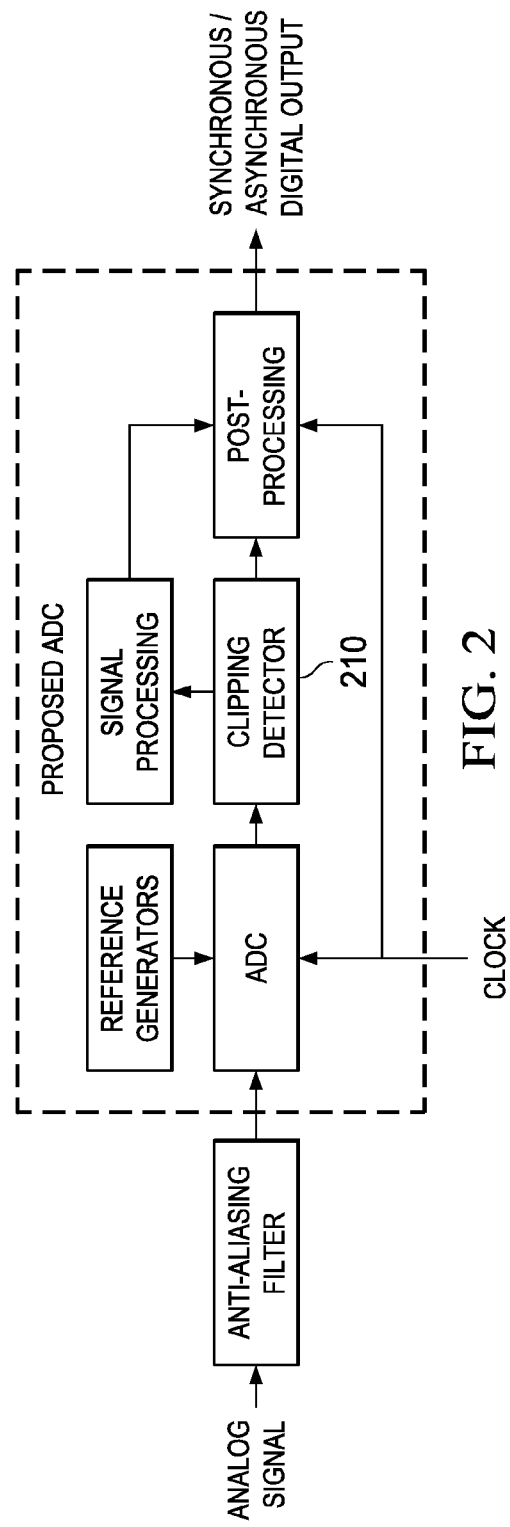

EXTENSION OF ADC DYNAMIC RANGE USING POST-PROCESSING LOGIC

PRIORITY

This Application claims priority to Indian Application No. 1066/CHE/2013, filed Mar. 13, 2013, entitled "Leap Frog Sampler for Asynchronous ADCs", Indian Provisional Application No. 971/CHE/2013, filed Mar. 6, 2013, entitled "Low Complexity Non-Uniform Interpolation Algorithm", Indian Application 927/CHE/2013, filed Mar. 4, 2013, entitled "High Performance Non-Uniform Interpolation", Indian Application 913/CHE/2013 "ADC Range Extension Using Post-Processing Logic" filed Mar. 1, 2013, and Indian Application No. 1132/CHE/2013, entitled "Rate Enhancement Techniques for Asynchronous Samplers", filed Mar. 15, 2013, the entireties of all of which are hereby incorporated by reference.

Also, this application claims the benefit of U.S. Provisional Application No. 61/922,271, filed Dec. 31, 2013, and U.S. Provisional Application No. 61/922,282, filed Dec. 31, 2013, and U.S. Provisional Application No. 61/922,291, filed Dec. 31, 2013, and U.S. Provisional Application No. 61/922,309, filed Dec. 31, 2013, and U.S. Provisional Application No. 61/922,316, filed Dec. 31, 2013, and U.S. Provisional Application No. 61/922,533, filed Dec. 31, 2013, the entireties of all of which are hereby incorporated by reference.

TECHNICAL FIELD

This Application is directed, in general, to analog to digital converters and, more specifically, to analog to digital converters which employ algorithms to compensate for out of range distortions.

BACKGROUND

Generally, ADC is an electronic circuit which converts the continuous time, continuous amplitude signal into discrete amplitude (quantization) and discrete time samples (sampling) which are suitable for processing further using digital logic and/or computer software. Depending on whether a clock is supplied to the ADC and digital samples are obtained in synchronization with the edges of the clock, ADCs can be broadly classified as (a) synchronous ADCs and (b) asynchronous ADCs. The quality of the ADC conversion is usually measured in terms of effective number of bits (ENOB) or Signal-to-Noise and Distortion Ratio (SNDR) for the given (synchronous) output sampling rate. This ENOB/SNDR can be different from another unit used to measure the output sample quality called the resolution which indicates the number of bits used to represent the output samples.

The input signal range that the ADC can handle is usually measured in terms of the signal swing (e.g., in Volts peak-to-peak (Vpp)) within which the ADC converts the analog signal into digital samples which are linearly related to the input signal amplitude at the sampling time instants. This input dynamic range may be specified in terms of the signal swing such as +/−0.5 V (1 Vpp), +/−1 V (2Vpp), etc.

In prior art, ADC exists in multiple architectures such as (a) Pipeline ADC, (b) Successive Approximation (SAR) ADC, (c) Delta-Sigma ADC, (d) Flash ADC, etc. All the above ADCs are synchronous ADCs where the sampling is done in synchronization with one or both of the edges of the clock supplied to the ADC. Different ADC architectures may have different conversion time requirements. Hence, a sample and hold (S-H) is used typically to hold the information of the continuous time signal at the time of sampling and then converted to digital output. The digital outputs also may be sent in synchronization with the input clock. The digital output maybe sent either serially or in parallel bus. In contrast, the asynchronous ADCs may not sample the continuous time signal in synchronization with the input clock. Moreover, the output sampling rate may not be integer multiples of the maximum frequency of the input signal.

FIG. 1. shows the block diagram of the prior art ADCs. The anti-aliasing filter is also used to limit the swing of the input signal to the ADC.

Generally, in the prior art, the input signal swing is limited to less than the maximum input signal swing by the anti-aliasing filter or driver which precedes the ADC. When the input signal exceeds the desired range, the anti-aliasing filter output will be compressed (that is, a soft-clipping of the voltage levels beyond the range supported by the filter or ADC) and hence ADC output digital representation codes will be clipped to a particular code value accordingly.

In case that anti-aliasing filter or driver did not enforce the input signal swing, the output of the ADC will be clipped to the maximum code which corresponds to the maximum input signal amplitude.

Therefore, there is a need in the art as understood by the present inventors to recover the clipped signal in a manner that addresses at least some of the concerns of the usage of the prior art.

SUMMARY

A first aspect provides an apparatus, comprising: an analog to digital converter including: a clipping detector; and a post-processor, wherein the post processor generates synchronous values of clipped data based on non-clipped values of non-clipped or non-compressed input analog signal.

A second aspect provides receiving an analog signal in an ADC converter in the ADC. The ADC converter can be a synchronous (except Delta-Sigma) or asynchronous converter; using a synchronous (except Delta-Sigma) or asynchronous converter to generate the digital representation of the analog signal, {D}; determining if a clipping event has occurred; detecting from the digital samples (and/or analog waveform) detect which samples, {C} were corrupted by a clipping event; removing the corrupted samples {C} from the digital signal representation, {D}, and sending the remaining sample set, {SU} to the next step; using {SU} with one the non-uniform to uniform resampling algorithms a output set of synchronous samples, {SS}, is generated.

A third aspect provides an apparatus, comprising: an analog to digital converter including: a clipping detector; and a post-processor, wherein the post processor generates synchronous samples using an asynchronous to synchronous generator, selected from the group including at least one of: a spline or polynomial interpolation algorithm, an Akima algorithm; a modified Akima algorithm; and an augmented least squares solution.

BRIEF DESCRIPTION OF THE DRAWINGS

Reference is now made to the following descriptions:

FIG. 1 illustrates a prior art ADC;

FIG. 2 illustrates an ADC with a range extension capability constructed according to the principles of the present Application;

DETAILED DESCRIPTION

Turning to FIG. 2, it can be observed that when the input signal is outside the dynamic range supported by the ADC, proposed ADC detects that and takes the output samples (digital codes) from the ADC and reconstructs the signal. These reconstructed samples replace the clipped signal samples by the post-processing unit depending on the clipping event. This post-processing can be implemented in hardware logic or embedded software running in Digital Signal Processors (DSPs) or micro-controller units (MCU).

In one of the embodiments the output signal samples are compared against a programmable clipping threshold level ($V_{clip}$). If the signal is above the threshold, the samples from the ADCs are dropped by the post-processing circuit. Similarly, when the signal is below the clipping threshold ($-V_{clip}$) for the negative amplitude signal, corresponding samples are dropped. This pruned set of samples is sent to a non-uniform signal interpolation algorithm for reconstructing the signal at those instants where the samples were dropped.

In one of the embodiments, cubic spline interpolation algorithm is used. However, one can implement any signal interpolation algorithm which can operate on non-uniformly sampled signal to produce either synchronous or asynchronous samples.

In one of the embodiments, the clipping threshold is taken as the maximum input voltage that the ADC can take ($V_{clip}=V_{max}$). Moreover, this threshold can be calibrated by observing the output SNDR of the reconstructed samples. The output SNDR is maximized for certain clipping threshold since the input signal conditioning circuits can exhibit non-linear behavior when driven with large swing input signals.

The detection of the clipping occurs in the clipping detector 210.

Figure 3:
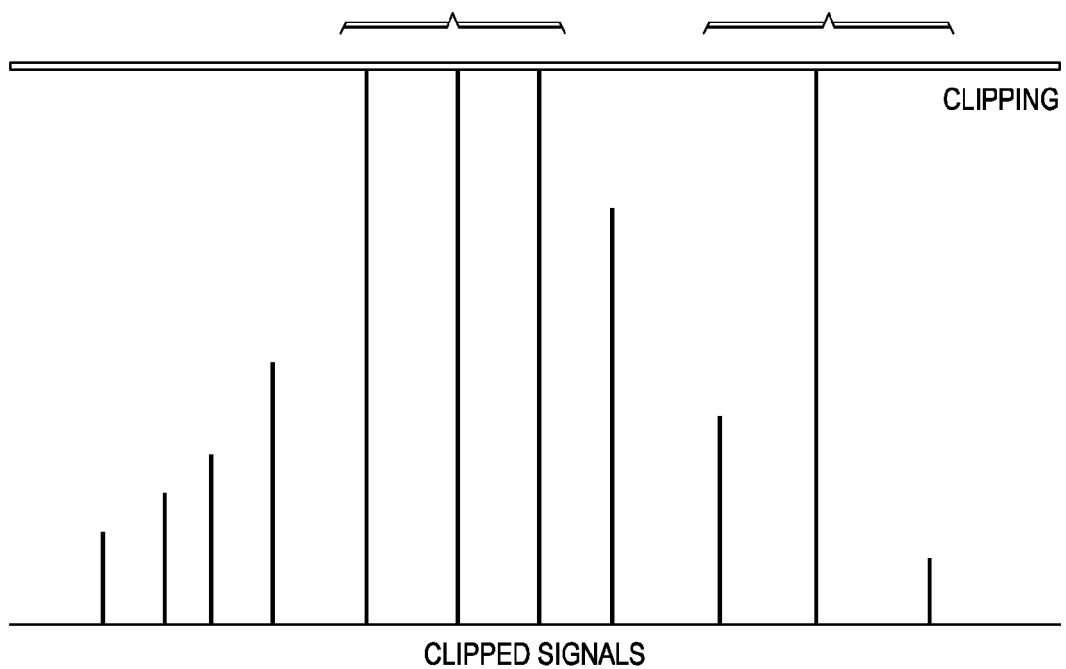
FIG. 3 illustrates example clipped input symbols as seen in an ADC.

FIG. 3 is an example of prior art input voltages that exceed rails.

Figure 4A:
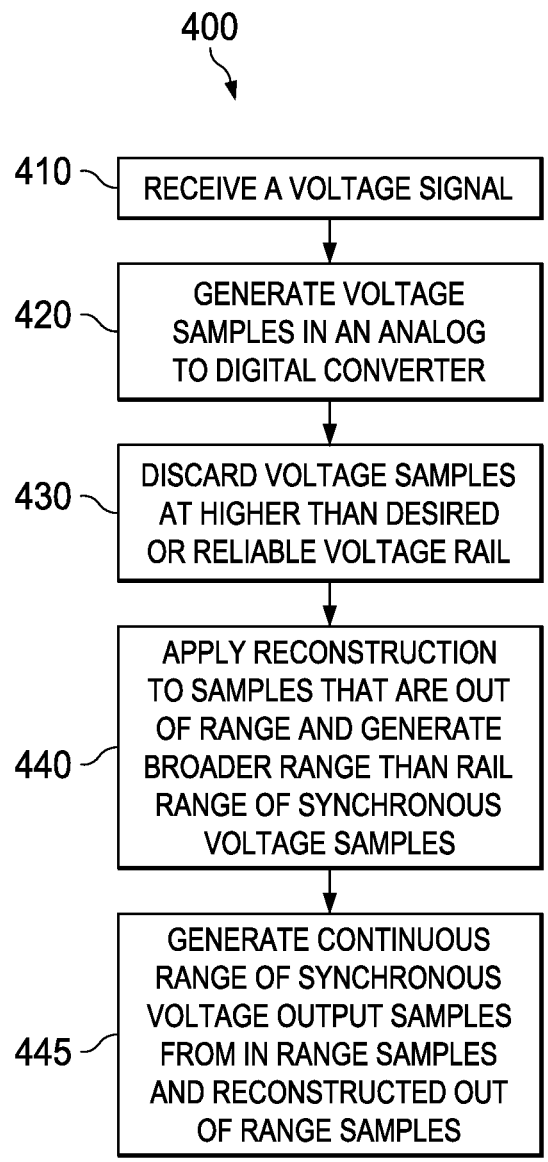
FIG. 4A. illustrates generating virtual symbols as output as seen in an ADC constructed according to the principles of the present Application.

FIG. 4A is an example method 400 of operation of the device 200 for generating synchronous samples of either synchronous or asynchronous input samples that are out of range;

In a step 410, a voltage signal is received.

In a step 420, voltage samples in an analog to digital converter are generated.

In a step 430, voltages are discarded that have a higher value than $V_{clip}$ or lower than $-V_{clip}$.

In a step 440, reconstruction is applies to samples that were discarded because they were out of range, and generate a broad range of synchronous samples than allowed by the range of allowable synchronous voltages;

In a step 445, a continuous range to synchronous output samples are generated from the sample that were not out of range to cover for the one that were in range.

Figure 4B:
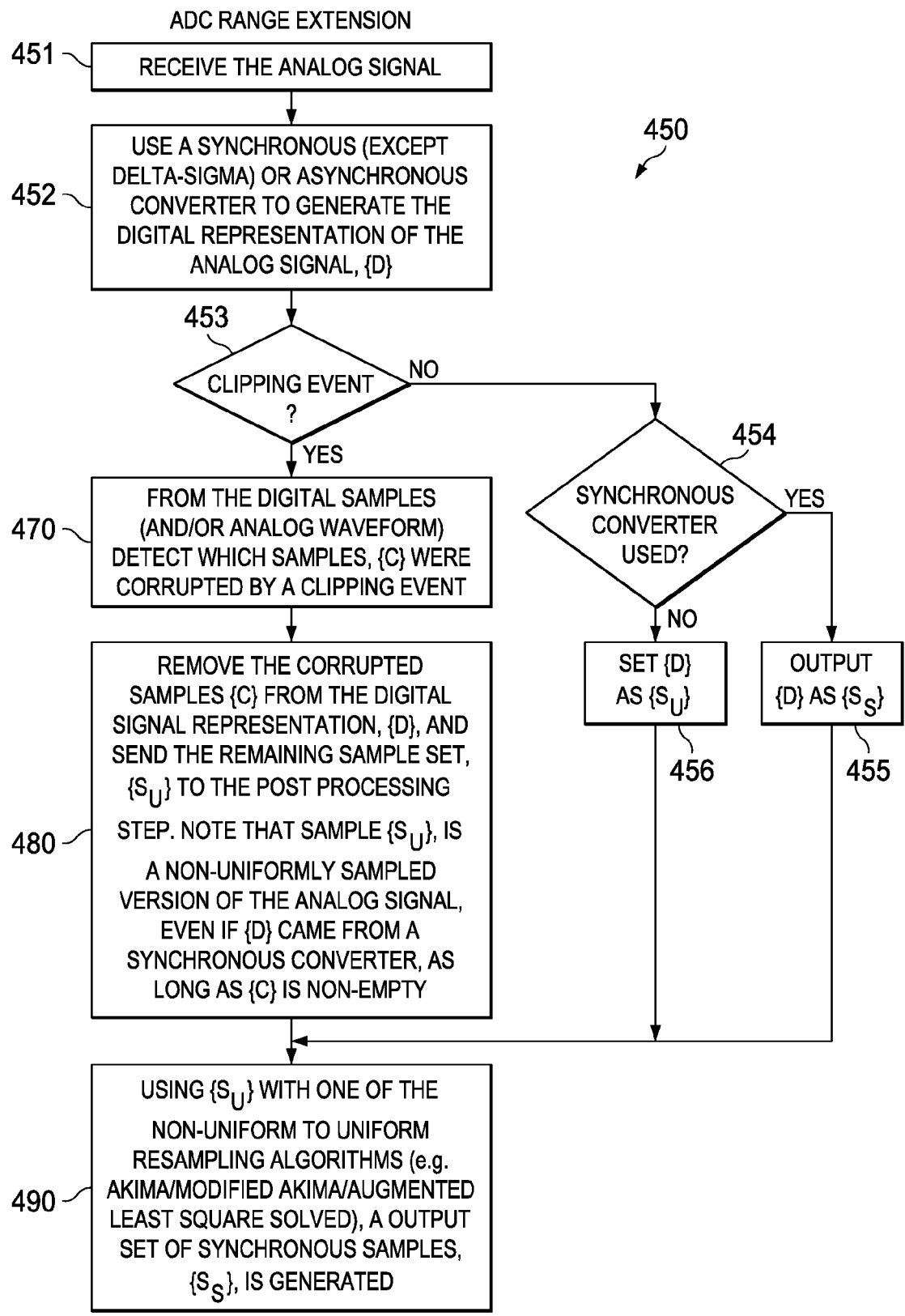
FIG. 4B illustrates generating symbols of an ADC of FIG. 4A in more detail.

FIG. 4B illustrates an alternative method 450 for calculating out of range values to be used with an ADC.

In a step 451, the ADC converter receives an analog signal. The ADC converter can be a synchronous (except Delta-Sigma) or asynchronous converter.

In a step 452, use a synchronous (except Delta-Sigma) or asynchronous converter to generate the digital representation of the analog signal, {D}.

In a step 453, it is determined if a clipping event has occurred. If, 'Yes' the method advances to step 40, if 'No' the method advances to a step 454.

In step 454, it is determined if a synchronous sampler is used. If yes, the method advances to step 255, and if not, to step 256.

In a step 455, Output {D} as {SS}.

In a step 456, Set{D} as {SU}.

In a step 470, from the digital samples (and/or analog waveform) detect which samples, {C} were corrupted by a clipping event.

In a step 480, remove the corrupted samples {C} from the digital signal representation, {D}, and send the remaining sample set, {SU} to the post processing step. Note that sample {SU}, is a non-uniformly sampled version of the analog signal, even if {D} came from a synchronous converter, as long as {C} is non-empty.

Then, the method ends in a step 490, wherein Using {SU} with one the non-uniform to uniform resampling algorithms (eg. Akima/Modified Akima/Augmented Least Square Solver), a output set of synchronous samples, {SS}, is generated.

Figure 5A:
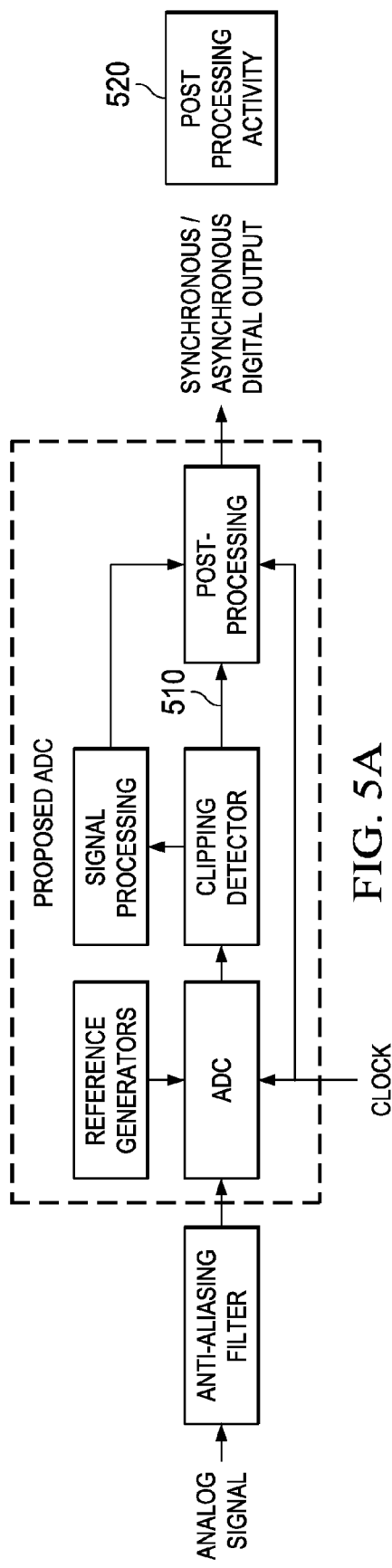
FIG. 5A illustrates a proposed ADC converter that uses a range extender.

Turning to FIG. 5A, in one of the embodiments, the reconstructed samples from interpolation circuit directly replace the samples that were clipped. However, there can be a post-processing algorithm such as Least-Squares (LS) which solves a system of equations to reconstruct the samples either at the same instants or different instants to maximize the SNDR using both the non-clipped original samples and the reconstructed samples at the clipped instants In one of the embodiments, the post-processing algorithm can implement a digital noise suppression filter which reduces the out-of-band noise in the samples that were given out of the ADC in a post processing activity 520.

In one of the embodiments, the post-processing algorithm is bypassed if the maximum of the signal is below the clipping threshold $V_{clip}$.

Figure 5B:
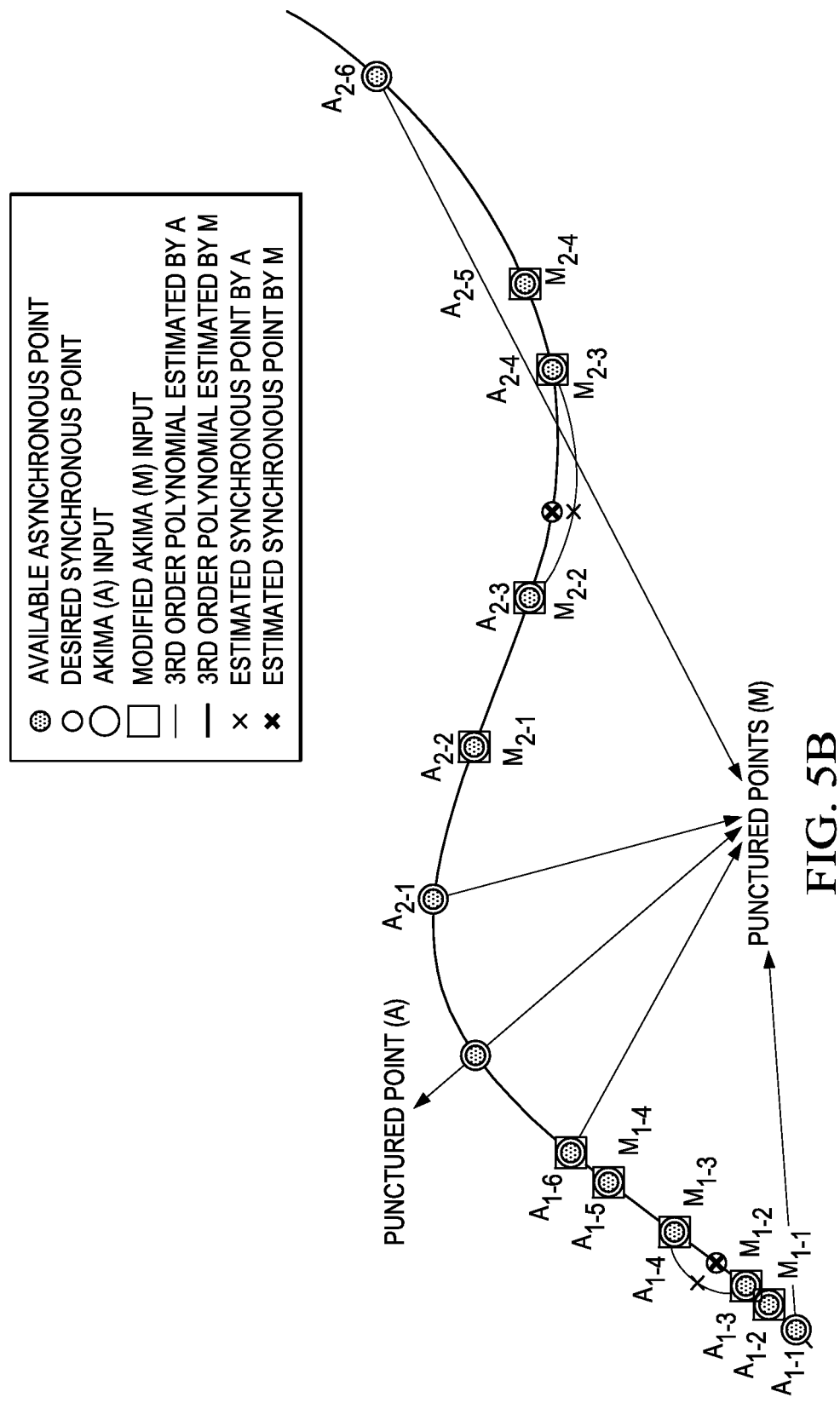
FIG. 5B illustrates a graphed output of an Akima and a "modified Akima algorithm" that calculates an analog-to digital synchronous signal from the inputted sampled asynchronous signals

Turning now to FIG. 5B, illustrated is an example Baseline Akima algorithm and its modified version to be used for reconstruction of a synchronous sample in the digital reconstruction and resampler 330 used within the range extender.

The objective of this algorithm, the Akima algorithm and the modified Akima algorithm, is to reconstruct the original signal, given a set of non-uniform samples from a band-limited signal.

It is known that sinc-kernel based reconstruction can be used to perfectly reconstruct the signal, when the average sampling rate is higher than the Nyquist rate. However such sinc-kernel based reconstruction is computationally expensive. One way to tradeoff performance with complexity in this scheme is by using truncated sinc kernels.

In the prior art, spline interpolation is another alternative algorithm which allows an attractive performance complexity tradeoff. Improved performance can be obtained, at the cost of higher complexity, by using higher order splines or by increasing the input sampling rate.

However, as understood by the present inventors, at reasonable input sampling rates, the Akima algorithm achieves moderate performance at low complexity. In fact, for moderate performance requirements, the Akima algorithm is lower complexity than truncated sinc reconstruction or even spline interpolation. Moreover, the complexity of the Akima algorithm depends on the output sampling rate and is independent of the input sampling rate, whereas the complexity of the other algorithms are dependent on both the input and output sampling rates.

In FIG. 5B, the baseline Akima algorithm is explained here. It fits a (different) third order piecewise polynomial function to every successive intervals of output points of the asynchronous samples created by the asynchronous ADC 330. Please note that the modified Akima algorithm is also illustrated here in this figure, as shall be detailed below.

For baseline Akima calculator, assume that a sequence of input (asynchronous or synchronous) points are available, and the six points around (three on either side) the first (or second) output point are denoted as $A_{1-1}, A_{1-2}, A_{1-6}$ (or $A_{2-1}, A_{2-2}, A_{2-6}$). Other asynchronous points, if any, are naturally punctured, i.e., disposed of. Let each of the points of interest, $A_{i-j}$, be represented by a 2-tuple $(x_{i,j}, y_{i,j})$, where i refers to the output index and j=1, . . . ,6 represent the six points of interest around it. These six points are used to completely describe the polynomial between $A_{1-3}$ and $A_{1-4}$ (the two asynchronous points surrounding the output point). The piece-wise polynomial can be expressed as, $$y(x)=p_0+p_1(x-x_{i,3})+p_2(x-x_{i,3})^2+p_3(x-x_{i,3})^3,$$

so that it satisfies the following conditions, $y(x_{i,3})=y_{i,3}$; $y(x_{i,4})=y_{i,4}$;

$$\left.\frac{dy}{dx}\right|_{x=x_{i,3}} = l_3$$

and $$\left.\frac{dy}{dx}\right|_{x=x_{i,4}} = l_4$$

where $l_3$ and $l_4$ are the slopes of the polynomial at $A_{1-3}$ and $A_{1-4}$ respectively.

Solving these equations, the following coefficient values are obtained.

$$p_0 = y_{i,3}; \quad p_1 = l_3; \quad p_2 = \left(3\frac{(y_{i,4}-y_{i,3})}{(x_{i,4}-x_{i,3})} - 2l_3 - l_4\right) / (x_{i,4}-x_{i,3});$$

$$p_3 = \left(l_3 + l_4 - 2\frac{(y_{i,4}-y_{i,3})}{(x_{i,4}-x_{i,3})}\right) / (x_{i,4}-x_{i,3})^2.$$

Note that, the slopes of polynomial at the two endpoints, $(x_{i,3}, y_{i,3})$ and $(x_{i,4}, y_{i,4})$, are given as $$l_3 = \frac{|m_4-m_3|m_2 + |m_2-m_1|m_3}{|m_4-m_3| + |m_2-m_1|}$$

and $$l_4 = \frac{|m_5-m_4|m_3 + |m_3-m_2|m_4}{|m_5-m_4| + |m_3-m_2|},$$

where $$m_j = \frac{y_{i,j+1}-y_{i,j}}{x_{i,j+1}-x_{i,j}}.$$

A straightforward implementation of this algorithm, assuming all divisions are implemented as look-up tables, would need 17 multipliers and 20 adders (ignoring multipliers with constants and table-lookups).

Figure 6A:
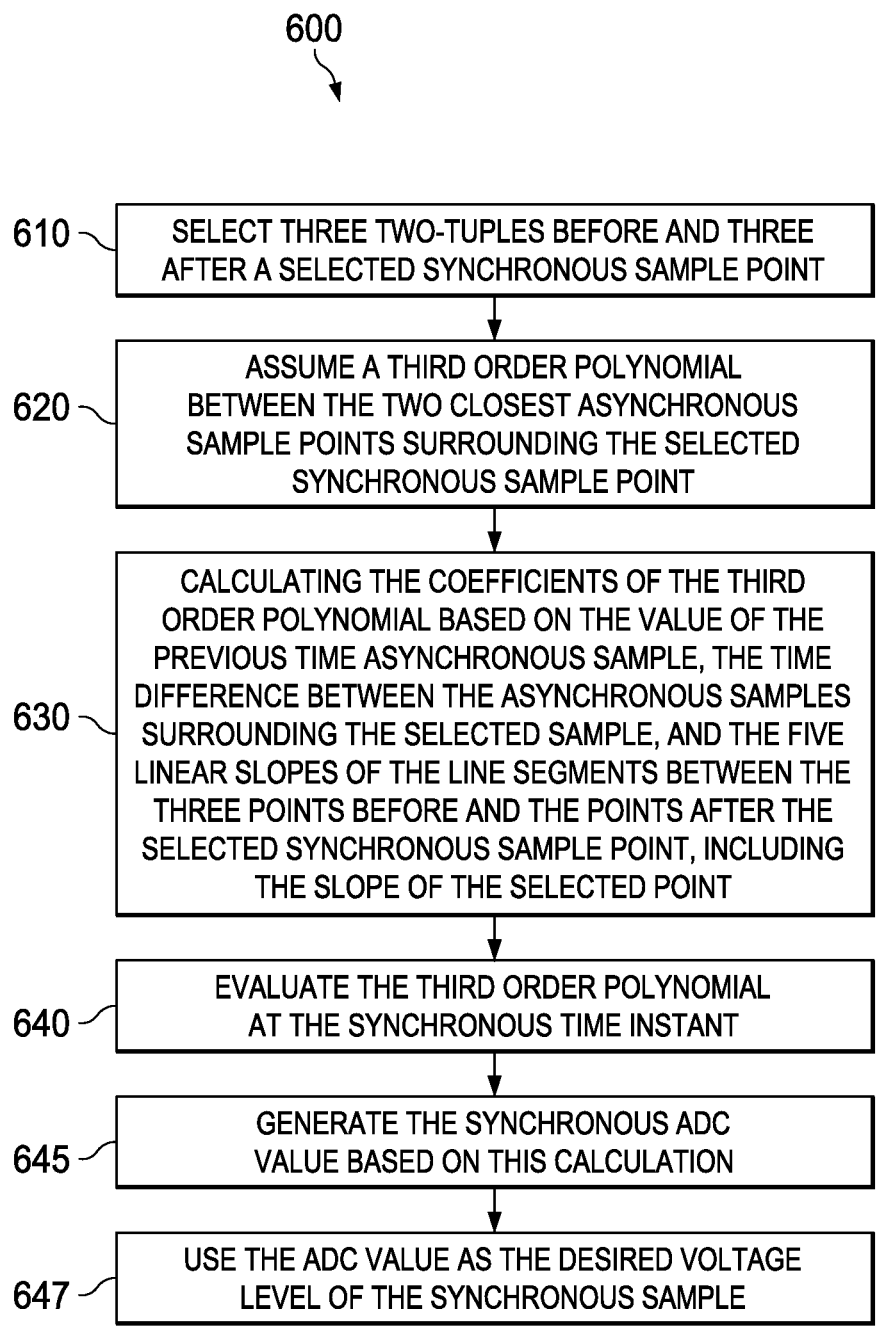
FIG. 6A illustrates an Akima algorithm method that can be used with the range extender.

Regarding the above, FIG. 6A illustrates a method of Akima algorithm that can be used to generate out of range samples.

In a step 610, select three 2-tuples before and three after a selected synchronous ADC conversion 610

In a step 620, assume a third order polynomial between the two closest asynchronous sample points surrounding the selected synchronous sample point.

In a step 630, calculating the coefficients of the third order polynomial based on the value of the previous time asynchronous sample, the time difference between the asynchronous samples surrounding the selected sample, and the five linear slopes of the line segments between the three points before and the points after the selected synchronous sample point, including the slope of the selected point.

In a step 640, evaluate the third order polynomial at the synchronous time instant In a step 645, generate the synchronous ADC value based on this calculation In a step 647, use the ADC value as the desired voltage level of the synchronous sample, wherein the synchronous ADC value is generated based on this calculation.

Modified Akima Algorithm

As advantageously appreciated by the present inventors, modifications done to the baseline Akima algorithm within another aspect of the asynchronous ADC 300.

The modified version of the algorithm uses four input points (unlike the baseline algorithm which uses six points) around each output point. For example, $A_{1-2}, \ldots, A_{1-5}$ (also denoted as $M_{1-1}, M_{1-2}, \ldots, M_{1-4}$) are used for the first reconstructed point and points $A_{2-2}, \ldots A_{2-5}$ (or $M_{2-1}, \ldots M_{2-4}$) are used for the second output point. Other asynchronous points, if any, are dropped (punctured) as before.

Apart from using fewer points, various other simplifications were made to the baseline algorithm, resulting in the two versions of the algorithm generating different cubic polynomials and estimated synchronous points.

The exact nature of the changes made to the baseline algorithm is summarized below.

The slope of the polynomial at point $A_{i,3}$, $l_3$, can be written as $$l_3 = \frac{w_1 m_2 + w_2 m_3}{w_1 + w_2},$$

where $w_1 = |m_4 - m_3|$ and $w_2 = |m_2 - m_1|$.

In this work, the weights are modified as modified as $w_1 = |x_{i,4} - x_{i,3}|^n$ and $w_2 = |x_{i,3} - x_{i,2}|^n$, where n is a programmable real number, typically $1 \leq n \leq 2$. The equations for $l_4$ can also be modified similarly. These modifications are intuitive in the sense that the point closer to the point of interest, gets a much higher weight.

Also as per this modification, only two neighboring points are needed to calculate the slope of the polynomial at each point, as opposed to four neighboring points. Note that, by this modification two multipliers (for each output point) are saved.

Instead of assuming the curve to be expressed as the third order polynomial given in baseline Akima algorithm outlined in the previous section, the following equation may be used $$y(x) = p_0 + p_1(x - x_{(i,3)}) + p_2(x - x_{(i,3)})(x - x_{(i,4)}) + p_3(x - x_{(i,3)})^2 (x - x_{(i,4)})$$

$$y(x_{i,3}) = y_{i,3};\ y(x_{i,4}) = y_{i,4};\ \left.\frac{dy}{dx}\right|_{x=x_{i,3}} = l_3 \text{ and }$$

$$\left.\frac{dy}{dx}\right|_{x=x_{i,4}} = l_4.$$

Putting the curve in the above form is better for fixed point considerations, since higher powers of the difference on one end of the curve are coupled with differences on the other end, thereby reducing overall precision requirements in fixed point. The complexity can be further reduced if the equations are normalized with respect to $(X_{i,3} - X_{i,2})$. Note that by doing this, the weight $w_2 = 1$.

Solving these equations, the following coefficient values are obtained, $$p_0 = y_{i,2};$$

$$p_1 = m_{i,3};$$

$$p_2 = (m_3 - l_3);$$

$$p_3 = (l_3 + l_4 - 2m_3)$$

For the coefficients, the following quantities are needed, $$l_3 m_3 = (l_3 - m_3) = \frac{w_2(m_2 - m_3)}{w_1 + w_2}$$

and $$l_4 m_3 = (l_4 - m_3) = \frac{w_2(m_4 - m_3)}{w_2 + w_3}.$$

The last two coefficients can be rewritten as $p_2 = -l_3 m_3$; $p_3 = (l_3 m_3 + l_4 m_3)$. It was also seen that performance can be marginally improved if $$l_3 m_3 = \frac{w_2(k_1 m_2 - m_3)}{w_1 + w_2}$$

and $$l_4 m_3 = \frac{w_2(k_2 m_4 - m_3)}{w_2 + w_3}$$

where k1, k2 are constants. Note that since, after normalization $w_2 = 1$, $l_3 m_3$ (and $l_4 m_3$) can be calculated using only 1 addition and 1 multiplication in addition to a table-lookup (ignoring the multiplication with a constant).

Figure 6B:
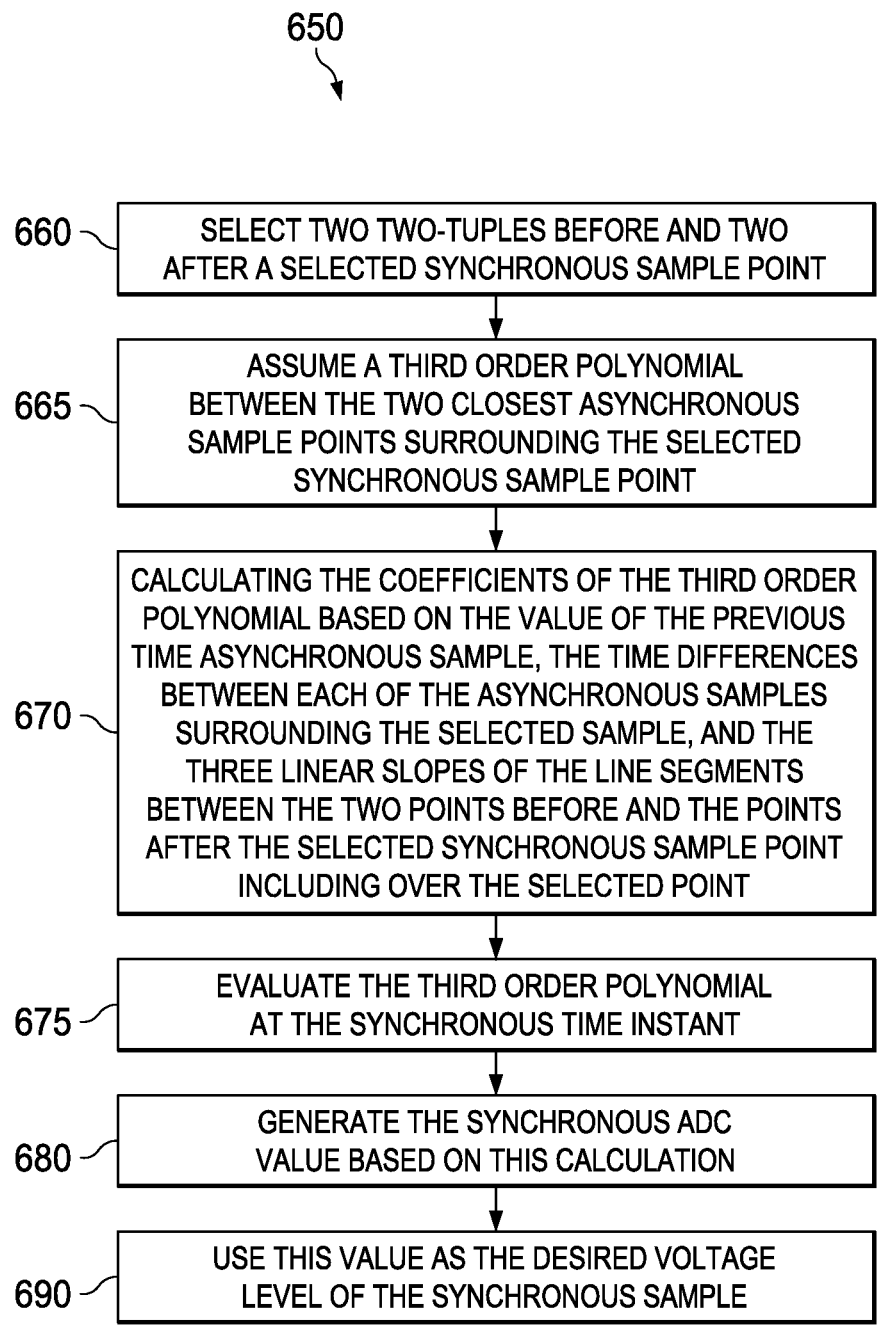
FIG. 6B illustrates a modified Akima algorithm method that can be used with the range extender.

Turning now to FIG. 6B, illustrated is a method 650, using the modified Akima as described above to determine points of the range extension.

In a step 660, select two 2-tuples before and two after a selected synchronous sample point.

In a step 665, assume a third order polynomial between the two closest asynchronous sample points surrounding the selected synchronous sample point.

In a step 670, calculate the coefficients of the third order polynomial based on the value of the previous time asynchronous sample, the time differences between each of the asynchronous samples surrounding the selected sample, and the three linear slopes of the line segments between the two points before and the points after the selected synchronous sample point including over the selected point.

In a step 675, the third order polynomial is evaluated at the synchronous time instant.

In a step 680, the synchronous ADC value is generated based on this calculation.

In a step 690, this ADC value is used as the desired voltage level of the synchronous sample to generate synchronous samples, that can be then used with the reconstructor.

Figure 7A:
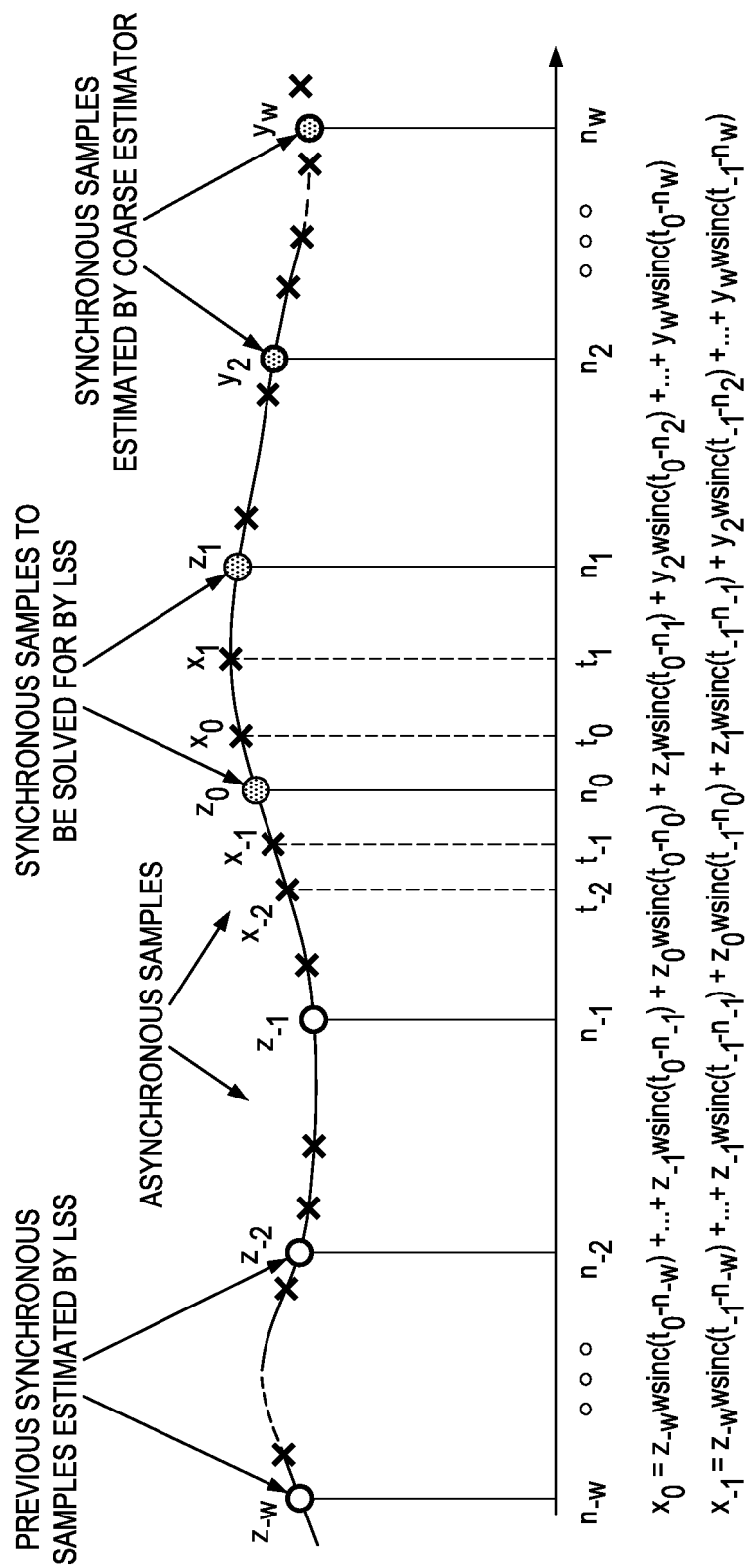
FIG. 7A illustrates a waveform that illustrates the relationships of samples of an asynchronous ADC sampler with reconstructor and range extender.

FIG. 7A shows the points used in estimating the signal value,
$z_0$ at the synchronous time point $n_0$.

$$f(t_0) = f(n_{-w}).\text{wsinc}(t_0 - n_{-w}) + \ldots + f(n_{-1}).\text{wsinc}(t_0 - n_{-1}) + f(n_0).\text{wsinc}(t_0 - n_0) + f(n_1).\text{wsinc}(t_0 - n_1) + f(n_2).\text{wsinc}(t_0 - n_2) + \ldots + f(n_w).\text{wsinc}(t_0 - n_w) \quad \text{Eqn. 5}$$

Using the coarse estimate $f(n_i) = y_i$ for $i \geq 2$ and fine estimate for $f(n_i) = z_i$ for $i < 2$, the above equation can be written as, $$x_0 = z_{-w}\text{wsinc}(t_0 - n_{-w}) + \ldots + z_{-1}\text{wsinc}(t_0 - n_{-1}) + z_0\text{wsinc}(t_0 - n_0) + z_1\text{wsinc}(t_0 - n_1) + y_2\text{wsinc}(t_0 - n_2) + \ldots + y_w\text{wsinc}(t_0 - n_w) \quad \text{Eqn. 6}$$

Similarly, the equation for the observation $(x-1, t-1)$ can be written as:

$$x_{-1} = z_{-w}\text{wsinc}(t_{-1} - n_{-w}) + \ldots + z_{-1}\text{wsinc}(t_{-1} - n_{-1}) + z_0\text{wsinc}(t_{-1} - n_0) + z_1\text{wsinc}(t_{-1} - n_1) + y_2\text{wsinc}(t_{-1} - n_2) + \ldots + y_w\text{wsinc}(t_{-1} - n_w) \quad \text{Eqn. 7}$$

All the $x_i$, $t_i$, $n_m$, $y_m$ & $z_{m\ (m<0)}$ are known. By looking up the windowed sinc values (wsinc) from lookup tables & evaluating constants, the following equations follow, $$c_0 = z_0 s_{00} + z_1 s_{01} \text{ and } c_{-1} = z_0 s_{-10} + z_1 s_{-11} \quad \text{Eqn. 8}$$

where $s_{im} = \text{wsinc}(t_i - n_m)$ &
$c_1 = x_1 - z_{-w}\text{wsinc}(t_1 - n_{-w}) - \ldots - z_{-1}\text{wsinc}(t_1 - n_{-1}) - y_2\text{wsinc}(t_1 - n_2) - \ldots - y_w\text{wsinc}(t_1 - n_w)$ From these, $z_0$ can easily be found as $$z_0 = (c_0 s_{-11} - c_{-1} s_{01})/(s_{00} s_{-10} s_{01}) \quad \text{Eqn. 9}$$

Thus, in this simple embodiment, the least squares solution reduces to a closed form expression. $z_1$ is not calculated from this set of equations given in Eqn. 8, as it would have a large error since the asynchronous points chosen are far away from it & the sinc function value will be low at that distance.

After $z_0$ is found, the entire window is made to slide and center at n1. $z_1$ & $z_2$ are treated as unknowns, $y_{w+1}$ is taken from Akima and the equations at two asynchronous points around $n_1$ are solved to yield $z_1$. The process is thus repeated at every output point.

In general, the LSS can be formulated to fit many asynchronous observations (xi,ti) around the output point, with several zm's (m>=0) kept unknown (ym's not used for these). This results in a set of matix equations $$[C]_{px1} = [S]_{pxq} \cdot [Z]_{qx1}, \quad \text{Eqn. 10}$$

where p is the number of asynchronous observations to solve for and q is the number of unknown synchronous outputs.

This can be solved by the pseudo-inverse computation:

$$Z = S^+ \cdot C = (S^T S)^{-1} \cdot S^T \cdot C.$$

For small matrix sizes, it may be practical to get a closed-form expression for the output z0. Increasing the window size, w gives better performance, and it could be used to reduce complexity by lowering p & q (and offset the performance loss due to this).

Contrast this with conventional formulations which solve simultaneous equations at all the asynchronous points in a block (usually needs a pseudo-inverse computation of a large sized matrix).

Figure 7B:
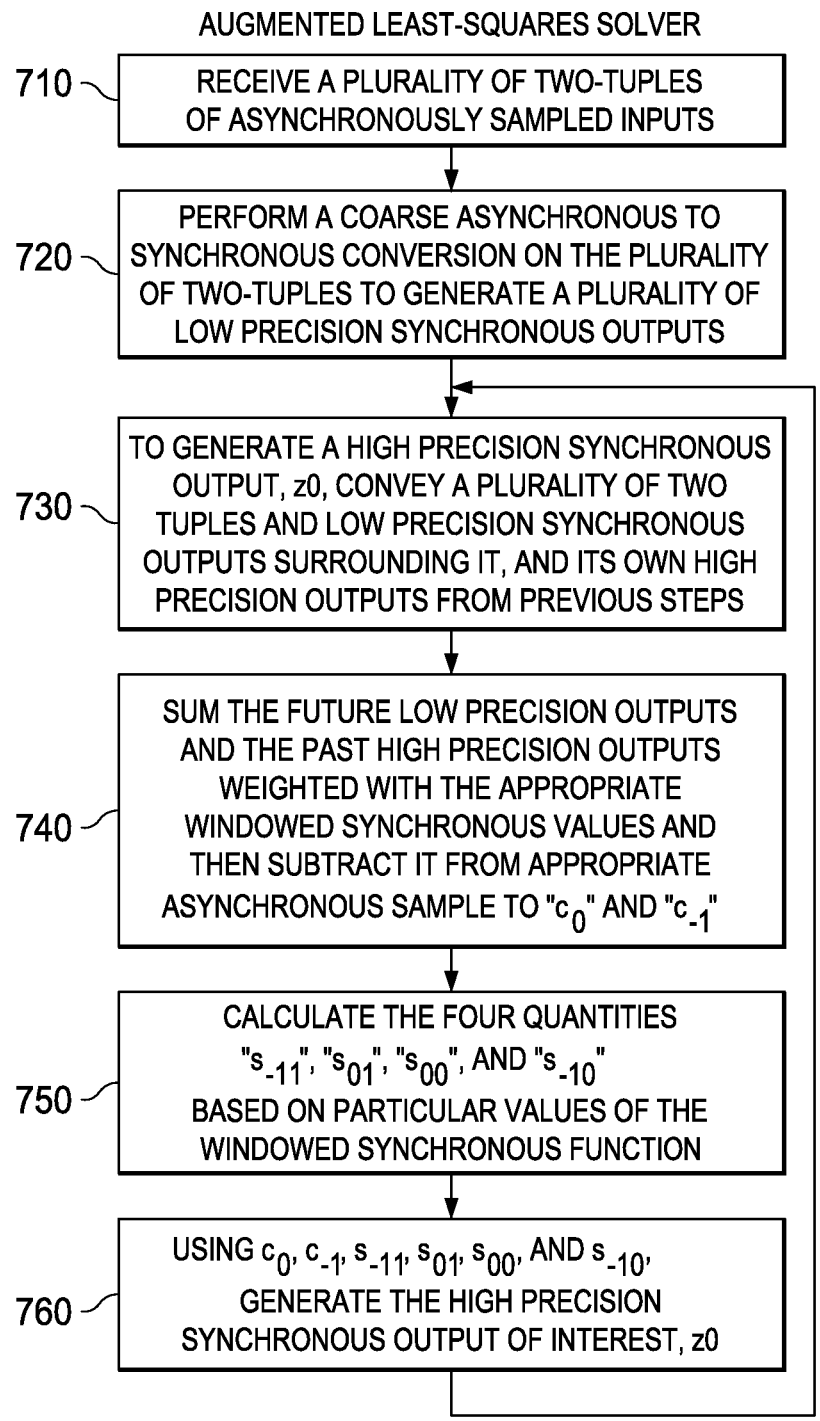
FIG. 7B illustrates a least squares solver that can be used with the range extender.

FIG. 7B illustrates an augmented least squares solver that can be used within the post processing 520 to determine selected synchronous points within the out of range.

In a step 710, the coarse reconstruction 1410 or the modified Akima reconstruction 1460 receive a plurality of two-tuples of Asynchronously Sampled Inputs.

In a step 720 a coarse asynchronous to synchronous conversion is performed on the plurality of two-tuples to generate a plurality of low precision synchronous outputs.

In a step 730, a high precision synchronous output, $z_0$ is generated, and is conveyed as well as a plurality of two tuples and low precision synchronous outputs surrounding it, and its own high precision outputs from previous steps.

In a step 740, the future low precision outputs and the past high precision outputs are summed wherein they are weighted with the appropriate windowed sinc. values and then subtract it from appropriate asynchronous sample to "$c_0$" and "$c_{-1}$".

In a step 750, the four quantities he four quantities "$s_{-11}$", "$s_{01}$", "$s_{00}$" and "$s_{-10}$" are calculated based on particular values of the windowed sinc. Function.

In a step 760, Using $c_0, c_{-1}, s_{-11}, s_{01}, s_{00}$ and $s_{-10}$, the high precision synchronous output of interest, $z_0$ is generated.

Advantages of Least Squares Solver Approach

A windowed sinc kernel is similar to a high order spline in performance. So, as compared to spline/polynomial filters, high performance (ENOB) reconstruction can be achieved at low asynchronous rates. Also, the sinc kernel limits the bandwidth of the output, filtering out-of band noise. Both these result in large savings of analog complexity/power consumption.

As compared to traditional block solver based approaches (that solve a simultaneous set of equations at the asynchronous points & require a matrix inversion), the complexity & power consumption of the reconstruction engine is heavily reduced.

A simple, non-iterative form, involving only forward computations make it conducive to hardware/real-time implementations since pipelining the internal computations does not impact the overall throughput [Note: both Spline interpolation & block solvers have this issue]

Low latency compared to block/matrix inversion based implementations, as we don't have to wait for data of the whole block to reconstruct the first point. [Note: Akima algorithm is well suited for the augmentation as it also has a non-iterative form and low latency]

Generally, FIG. 6A-6B and 7B can be used to generate synchronous points within the post-processing logic 520

Figure 8:
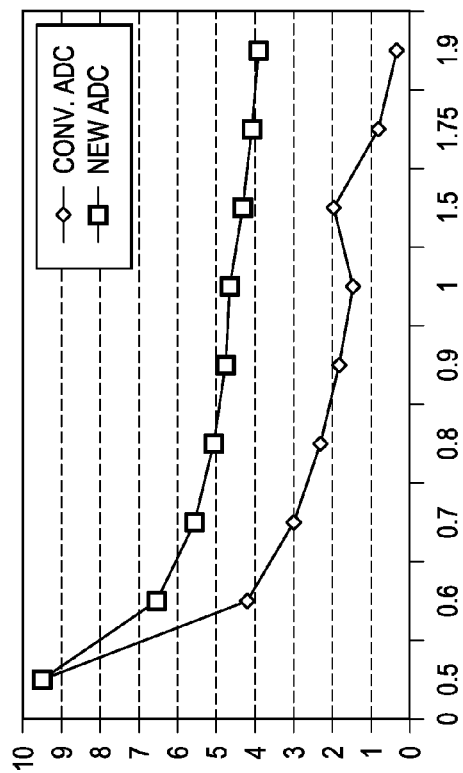
FIG. 8 illustrates simulated data regarding the range extender ADC.

FIG. 8 shows the results from a numerical simulation for a sinusoid tone whose amplitude is varied. The output SNDR (measured in ENOB) for the conventional ADC and the proposed range extended ADC are plotted against the amplitude of the input sinusoid. The clipping threshold of the conventional ADC is set to +/−0.5 V. The clipped signal waveform is post-processed by signal processing engine described above. It can be seen that even for small clipping probability; the SNDR of the conventional ADC is reduced significantly. On the other hand, the proposed range extended ADC provides at least 2 bits more at all input signal amplitudes above the clipping threshold. When the signal is not clipped, the reconstruction algorithm is bypassed.

Those skilled in the art to which this application relates will appreciate that other and further additions, deletions, substitutions and modifications may be made to the described embodiments.

What is claimed is:

1. An apparatus, comprising:
    an analog to digital converter including:
        a clipping detector; and
        a post-processor, wherein the post processor generates synchronous values of clipped data based on non-clipped values of non-clipped and non-compressed analog input signal,
    wherein a programmable threshold is used in the clipping detector;
    wherein the post processor employs an Akima algorithm, and
    wherein the post processor further comprising means for assuming a Third Order Polynomial between the two closest asynchronous sample points surrounding the desired synchronous output sample point.

2. The apparatus of claim 1, further comprising a means for puncturing asynchronous samples that are not within three samples of any synchronous output sample point.

3. The apparatus of claim 2, wherein the puncturing of asynchronous samples that are not within three samples of any synchronous output point, leading to less power than using all asynchronous samples.

4. The apparatus of claim 3, wherein a calculation of wherein the puncturing of asynchronous samples that are not within three samples of any synchronous output point is computationally less intensive than using all asynchronous samples.

5. The apparatus of claim 1, wherein the post processor employs a modified Akima algorithm.

6. The apparatus of claim 1, wherein the post processor employs a least squares solver in conjunction with the modified Akima algorithm.

7. The apparatus of claim 1, wherein the ADC is a synchronous converter other than a sigma-delta.

8. The apparatus of claim 1, wherein the ADC is an asynchronous converter.

9. A method, comprising:
    receiving in the ADC converter receives an analog signal, using a synchronous (except Delta-Sigma) or asynchronous converter to generate the digital representation of the analog signal, {D}, determining if a clipping event has occurred;

detecting from the digital samples (and/or analog waveform) detect which samples, {C} were corrupted by a clipping event, removing the corrupted samples {C} from the digital signal representation, {D}, and sending the remaining sample set, {SU} to the next step;

using {SU} with one the non-uniform to uniform resampling algorithms a output set of synchronous samples, {SS}, is generated., wherein the non-uniform to uniform resampling algorithm employs a Third Order Polynomial between the two closest asynchronous sample points surrounding the desired synchronous output sample point.

10. The method of claim 9, further comprising selecting the non-uniform to uniform sampler from at least one of the three including: Akima/Modified Akima/Augmented Least Square Solved, and a polynomial interpolation.

11. The method of claim 10, wherein the polynomial interpolation is a spline interpolation.

12. The method of claim 9, further comprising determining if a synchronous sampler is used.

13. An apparatus, comprising:
An analog to digital converter including:
    a clipping detector; and
    a post-processor, wherein the post processor generates synchronous samples using an asynchronous to synchronous generator, selected from the group including at least one of:
        an Akima algorithm;
        a modified Akima algorithm; and
        a least squares solution; and
        a polynomial interpolation;
    a means for selecting the non-uniform to uniform sampler from at least one of the three including: Akima/Modified Akima/Augmented Least Square Solved, and a polynomial interpolation; and
    a means for puncturing asynchronous samples that are not within three samples of any synchronous point.

14. The apparatus of claim 13, wherein the polynomial interpolation is a spline interpolation.

15. The method of claim 13, wherein the polynomial interpolation is a spline interpolation.

* * * * *